(12) United States Patent
Chen et al.

(10) Patent No.: US 6,812,067 B2
(45) Date of Patent: Nov. 2, 2004

(54) METHOD FOR INTEGRATING COMPOUND SEMICONDUCTOR WITH SUBSTRATE OR HIGH THERMAL CONDUCTIVITY

(75) Inventors: Tzer-Perng Chen, Hsinchu (TW); Chih-Sung Chang, Hsinchu (TW); Kuang-Neng Yang, Hsinchu (TW)

(73) Assignee: United Epitaxy Company, Ltd., Hsinchu (TW)

( * ) Notice: Subject to any disclaimer, the term of this patent is extended or adjusted under 35 U.S.C. 154(b) by 43 days.

(21) Appl. No.: 10/316,088

(22) Filed: Dec. 11, 2002

(65) Prior Publication Data

US 2003/0178637 A1 Sep. 25, 2003

(30) Foreign Application Priority Data

Mar. 25, 2002 (TW) ........................................ 91105718 A
Aug. 5, 2002 (TW) ........................................ 91117570 A

(51) Int. Cl.⁷ .............................................. H01L 21/44
(52) U.S. Cl. ........................................ 438/122; 438/643
(58) Field of Search .......................... 438/26, 108, 122

(56) References Cited

U.S. PATENT DOCUMENTS 5,385,632 A * 1/1995 Goossen ...................... 438/25
5,776,512 A * 7/1998 Weber ........................ 425/116

FOREIGN PATENT DOCUMENTS

EP          0 388 011 A2      9/1990

* cited by examiner

*Primary Examiner*—Douglas Wille
(74) *Attorney, Agent, or Firm*—Nixon Peabody, LLP; Donald R. Studebaker

(57) ABSTRACT

A method for integrating a compound semiconductor with a substrate of high thermal conductivity is provided. The present invention employs a metal of low melting point, which is in the liquid state at low temperature (about 200° C.), to form a bonding layer. The method includes the step of providing a compound semiconductor structure, which includes a compound semiconductor substrate and an epitaxial layer thereon. Then, a first bonding layer is formed on the epitaxial layer. A substrate of thermal conductivity greater than that of the compound semiconductor substrate is selected. Then, a second bonding layer is formed on the substrate. The first bonding layer and the second bonding layer are pressed to form an alloy layer at low temperature.

35 Claims, 2 Drawing Sheets

US 6,812,067 B2

METHOD FOR INTEGRATING COMPOUND SEMICONDUCTOR WITH SUBSTRATE OR HIGH THERMAL CONDUCTIVITY

CROSS REFERENCE TO RELATED APPLICATIONS

This application claims priority to Taiwan Patent Application No. 091105718 entitled "Method for Combining a Compound Semiconductor with a Substrate of High Thermal Conductivity", filed Mar. 25, 2002, and Taiwan Patent Application No. 091117570 entitled "Method for Integrating Compound Semiconductor with Substrate of High Thermal Conductivity", filed Aug. 5, 2002.

FIELD OF THE INVENTION

The present invention generally relates to a method for integrating a compound semiconductor with a substrate of high thermal conductivity, and more particularly to a method for employing indium (In) and gold (Au) to integrate a compound semiconductor with a high thermal conductivity substrate.

BACKGROUND OF THE INVENTION

Compound semiconductors, in general, are epitaxial layers formed on a substrate of III–V group, such as gallium arsenide (GaAs), indium phosphide (InP), gallium phosphide (GaP), or sapphire, or on a aluminum oxide ($Al_2O_3$) substrate to form N type or P type semiconductors. The epitaxial substrate is then treated with processes, for example, chemical, photolithographic, etching, evaporation, and polishing processes, to form a compound semiconductor device, such as a light emitting diode (LED). The substrate is then diced into a device chip. The device chip is assembled and packaged to become commercial products, such as light bulbs.

The substrate provided for the epitaxial growth process is generally of low thermal conductivity (for example, less than 80 W/m-K). When the device operates at high current, the device usually fails to achieve high output power. Furthermore, the life of the device is seriously affected by the external factor, such as weather, due to the low conductivity of the substrate.

Therefore, there is a need to provide a method for forming epitaxial layers on a high thermal conductivity substrate.

OBJECTS AND SUMMARY OF THE INVENTION

One aspect of the present invention is to provide a method for forming a compound semiconductor on a substrate of high thermal conductivity. The present invention employs a metal of low melting point to integrate the compound semiconductor with the high thermal conductivity substrate to improve the device life and the device performance of high output power.

It is another aspect of the present invention to provide a method for forming a vertical chip structure requiring only a single conducting wire that simplifies the wiring procedure and reduces the production cost.

It is a further aspect of the present invention to provide a low temperature process (about in the range of 156° C. to 400° C.) to achieve a better conductive connection.

It is yet another aspect of the present invention to provide a method for connecting a compound semiconductor to a substrate. The present invention employs a metal of low melting point, which is in the liquid state at low temperature (about 200° C.), to form a bonding layer. Therefore, the compound semiconductor is tightly connected to the substrate using the bonding layer, even when the surface of the compound semiconductor is not smooth.

It is another aspect of the present invention to provide a method for forming a device on a high thermal conductivity substrate of excellent heat dissipation at low cost and high yield.

The method includes the step of providing a compound semiconductor structure. The compound semiconductor structure includes a first substrate and an epitaxial layer thereon. Then, a first bonding layer is formed on the epitaxial layer. A second substrate of thermal conductivity higher than that of the first substrate is selected. Then, a second bonding layer is formed on the second substrate. The first bonding layer and the second bonding layer are pressed to form an alloy layer at low temperature.

The first substrate in the compound semiconductor structure is a compound semiconductor substrate including a material such as gallium arsenide (GaAs), indium phosphide (InP), gallium phosphide (GaP), sapphire, or the like. The high thermal conductivity substrate is formed of a material such as silicon (Si), aluminum (Al), copper (Cu), gold (Au), silver (Ag), silicon carbon (SiC), diamond, graphite, molybdenum (Mo), aluminum nitride, and the like. The temperature of forming the alloy layer is in a range between about 156° C. and 400° C. The key aspect of the present invention is that one of the first and the second bonding layers is a metal layer with a melting point in a range between about 150° C. and 400° C., such as an indium layer. The other bonding layer is a layer of any material, such as gold, which can form an alloy with the metal, such as indium. Therefore, during the bonding step, the metal of low melting point is in a liquid state to simplify the process.

The step of forming the second bonding layer includes the step of forming a wetting layer on the second substrate. Then, a barrier layer is formed on the wetting layer. Next, the second bonding layer is formed on the barrier layer. The wetting layer improves the adherence of subsequent layer to the high thermal conductivity substrate. The barrier layer prevents the internal diffusion of the second bonding material to other layers.

Additionally, the method further includes the step of forming a protective layer on the high thermal conductivity substrate to prevent undesired chemical reactions that damages the high thermal conductivity substrate. The protective layer includes a material such as nickel (Ni), gold (Au), silver (Ag), chromium (Cr), or the like.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE INVENTION

The exemplary embodiment of present invention discloses a method which employs a metal of low melting point to integrate a compound semiconductor with a substrate of high thermal conductivity.

Figure 1:
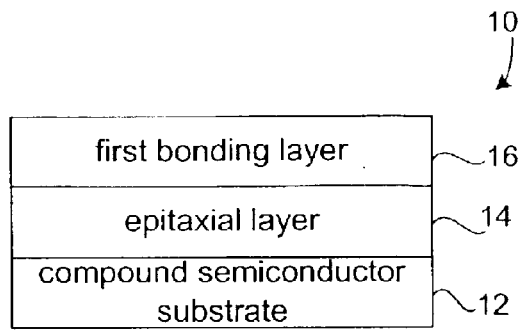
FIG. 1 is a schematic cross-sectional view of a compound semiconductor structure and a first bonding layer thereon in one embodiment of the present invention.

Referring to FIG. 1, the method includes the step of providing a compound semiconductor structure 10. The compound semiconductor structure 10 includes a compound semiconductor substrate 12 and an epitaxial layer 14 thereon. The compound semiconductor substrate 12 includes a material such as gallium arsenide (GaAs), indium phosphide (InP), gallium phosphide (GaP), sapphire, or the like. The epitaxial layer 14 can be an epitaxial multi-layer structure (or a compound semiconductor) and be formed by a conventional epitaxially growth technique. Then, a first bonding layer 16 is formed on the epitaxial layer 14.

Figure 2:
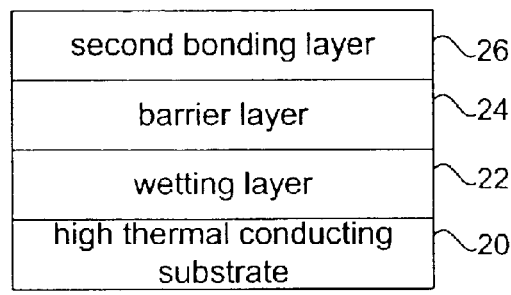
FIG. 2 is a schematic cross-sectional view of a high thermal conductivity substrate and a second bonding layer thereon in one embodiment of the present invention.

Referring to FIG. 2, a substrate 20 having a thermal conductivity greater than that of the compound semiconductor substrate 12 is selected. In general, the substrate 20 includes a material of thermal conductivity equal to or greater than 80 W/m-K ($\geq$80 W/m-K). The material of substrate 20 can be silicon (Si), aluminum (Al), copper (Cu), gold (Au), silver (Ag), silicon carbon (SiC), diamond, graphite, molybdenum (Mo), aluminum nitride, or the like. Then, a wetting layer 22 is optionally formed on the high thermal conductivity substrate 20. The wetting layer 22 serves the purpose to enhance the adherence of a subsequent layer to the substrate 20. The wetting layer 22 includes a material such as chromium (Cr), titanium (Ti), nickel (Ni), or the like.

A barrier layer 24 is optionally formed on the wetting layer 22. The barrier layer 24 serves the purpose of preventing the internal diffusion of the material of subsequent bonding layer 26 to the wetting layer 22 or the substrate 20. The barrier layer 24 includes a material selected from a group consisting of molybdenum (Mo), platinum (Pt), tungsten (W), indium oxide, tin oxide, indium tin oxide, zinc oxide, and magnesium oxide.

Then, a second bonding layer 26 is formed on the barrier layer 24. One key aspect of the exemplary embodiment of present invention is that one of the first and the second bonding layers, 16 and 26, is a metal layer, such as an indium layer, having a melting point in the range between about 150° C. and 400° C. The other bonding layer (26 or 16) is a layer of any material, such as gold, which forms an alloy-bonding layer with the metal layer. For example, when the first bonding layer 16 is a layer of gold, the second bonding layer 26 is an indium layer. Similarly, when the first bonding layer 16 is an indium layer, the second bonding layer 26 is a layer of gold. The method of forming the first and the second bonding layers, 16 and 26, includes conventional processes of deposition, evaporation, or sputter.

Figure 3:
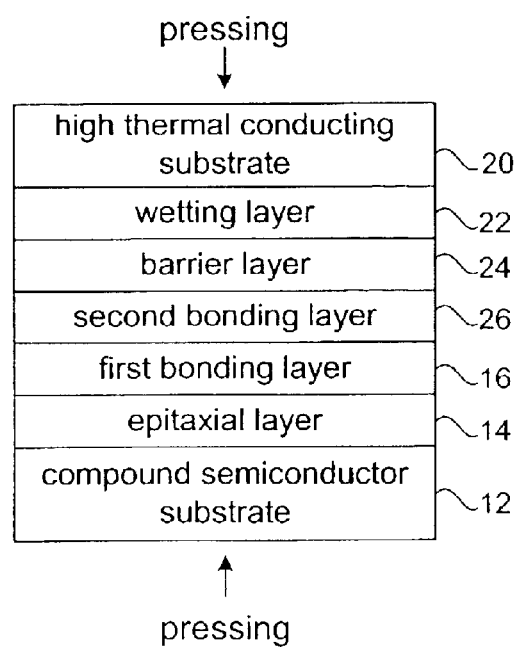
FIG. 3 is a schematic cross-sectional view of integrating the compound semiconductor structure with the high thermal conductivity substrate in one embodiment of the present invention.
Figure 4:
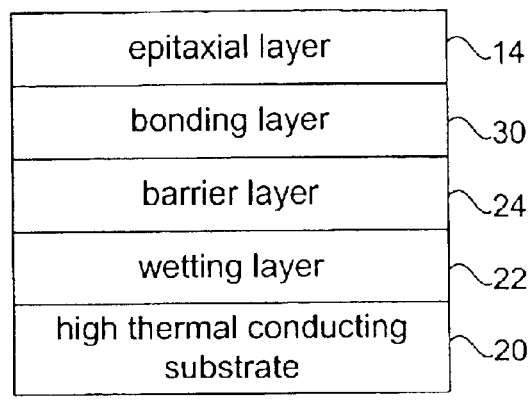
FIG. 4 is a schematic cross-sectional view of forming the compound semiconductor on the high thermal conductivity substrate in one embodiment of the present invention.

Referring to FIG. 3, the first bonding layer 16 and the second bonding layer 26 are positioned face to face and pressed at a temperature to form an alloy layer 30. The process temperature depends on the melting point of selected material of bonding layers. That is, the process temperature is preferably equal to or higher than the lower melting point of the two selected bonding materials. When selecting indium and gold as the bonding materials, the indium layer and the layer of gold are positioned face to face and pressed at a temperature between 156° C. and 400° C., preferably at a temperature of 200° C. The melting point of indium is 156° C., and therefore in an environment of 200° C. the indium is in a liquid state and forms an alloy layer 30, $AuIn_2$, with gold, as shown in FIG. 4. The melting point of the alloy, $AuIn_2$, is about 450° C., which is much higher than that of the indium layer.

It is an advantage of the exemplary embodiment of present invention that the bonding layer is in a liquid state during the bonding process. By simply applying a conventional hard press technique a uniform and solid connection is achieved, even when the compound semiconductor has an uneven surface.

Referring to FIG. 4, the substrate 12 in the compound semiconductor structure 10 is removed. The compound semiconductor (or the epitaxial layer 14) is integrated with the high thermal conductivity substrate 20. The substrate 12 is removed by a conventional process, such as a wet chemical etching or dry etching process. Therefore, the epitaxial layer 14 is integrated with the high thermal conductivity substrate 20 by using the bonding technique at low temperature.

Figure 5A:
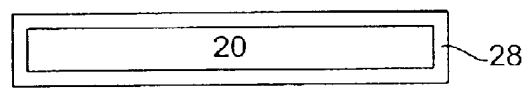
FIG. 5A is a schematic cross-sectional view of forming a protective layer on a high thermal conductivity substrate in one embodiment of the present invention.
Figure 5B:
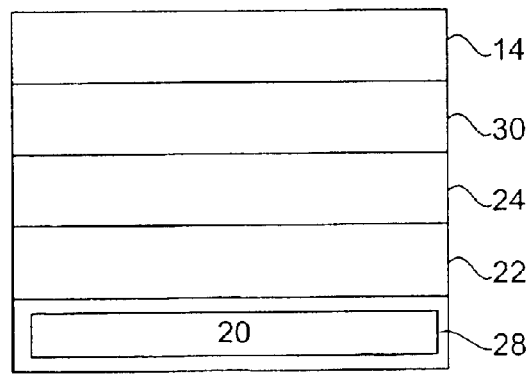
FIG. 5B is a schematic cross-sectional view of forming the compound semiconductor on the substrate having the protective layer in one embodiment of the present invention.

It is noted that the high thermal conductivity substrate 20, such as a copper or aluminum substrate is highly active to chemical reactants. Therefore, to prevent the high thermal conductivity substrate 20 from reacting with chemical reactants, particularly in the removal step of the substrate 12, a protective layer 28 is optionally employed. In other words, the method further includes the step of forming a protective layer 28 over the high thermal conductivity substrate 20 prior to the formation of the wetting layer 22, as shown in FIG. 5A. The protective layer 28 includes a material of low activity such as nickel (Ni), gold (Au), silver (Ag), chromium (Cr), or the like. The step of forming the protective layer 28 includes covering the high thermal conductivity substrate 20 with a thin metal layer of several micrometers by a conventional electroplate technique. It is noted that the thickness of the protective layer 28 is relatively small compared with the thickness of the substrate 20. Thus, the protective layer 28 does not significantly affect the thermal conductivity of the substrate 20. FIG. 5B is a schematic cross-sectional view of forming the compound semiconductor structure 10 on the high thermal conductivity substrate 20 having the protective layer 28 in the exemplary embodiment of the present invention.

The other advantages of employing the present invention includes forming a vertical chip structure requiring only a single conducting wire that simplifies the wiring procedure and reduces the production cost. The method of the present invention is a low temperature process (about in the range of 156° C. to 400° C.) to form a device on a high thermal conductivity substrate of excellent heat dissipation at low cost and high yield. Therefore, since the device is formed on the high thermal conductivity substrate 20, the device can be operated at high current and achieves high output power.

Although specific embodiments have been illustrated and described, it will be obvious to those skilled in the art that various modifications may be made without departing from what is intended to be limited solely by the appended claims.

What is claimed is:

1. A method for integrating a semiconductor structure with a substrate, comprising:
   providing said semiconductor structure having a first substrate and an epitaxial layer on said first substrate;
   forming a first bonding layer on said epitaxial layer;
   forming a second bonding layer on said substrate;
   integrating said first bonding layer with said second bonding layer to form an alloy layer; and
   removing said first substrate.

2. The method according to claim 1, wherein said substrate has a thermal conductivity equal to or greater than 80 W/m-K.

3. The method according to claim 1, wherein said first substrate is a compound semiconductor substrate, and wherein said compound semiconductor substrate comprises a material selected from a group consisting of gallium arsenide (GaAs), indium phosphide (InP), gallium phosphide (GaP), and sapphire.

4. The method according to claim 1, wherein said substrate comprises a material selected from a group consisting of silicon (Si), aluminum (Al), copper (Cu), gold (Au), silver (Ag), silicon carbon (SiC), diamond, graphite, molybdenum (Mo), and aluminum nitride.

5. The method according to claim 1, wherein said integrating step comprises:
   positioning said first bonding layer and said second bonding layer face to face; and
   pressing said first substrate and said substrate at a temperature in a range between about 156° C. and 400° C.

6. The method according to claim 1, wherein said first bonding layer is a metal layer, and wherein said metal layer has a melting point is in a range between about 150° C. and 400° C.

7. The method according to claim 6, wherein said first bonding layer comprises an indium (In) layer.

8. The method according to claim 7, wherein said second bonding layer comprises a layer of gold (Au).

9. The method according to claim 1, wherein said second bonding layer is a metal layer, and said metal layer has a melting point is in a range between about 150° C. and 400° C.

10. The method according to claim 9, wherein said second bonding layer comprises an indium (In) layer.

11. The method according to claim 10, wherein said first bonding layer comprises a layer of gold (Au).

12. The method according to claim 1, wherein said step of forming said second bonding layer comprises:
    forming a protective layer on said substrate;
    forming a wetting layer on said protective layer;
    forming a barrier layer on said wetting layer; and
    forming said second bonding layer on said barrier layer.

13. The method according to claim 12, wherein said protective layer comprises a material selected from a group consisting of nickel (Ni), gold (Au), silver (Ag), and chromium (Cr).

14. The method according to claim 12, wherein said wetting layer comprises a material selected from a group consisting of chromium (Cr), titanium (Ti), and nickel (Ni).

15. The method according to claim 12, wherein said barrier layer comprises a material selected from a group consisting of molybdenum (Mo), platinum (Pt), tungsten (W), indium oxide, tin oxide, indium tin oxide, zinc oxide, and magnesium oxide.

16. A method for forming a compound semiconductor structure on a high thermal conductivity substrate, comprising:
    providing said compound semiconductor structure having a compound semiconductor substrate and an epitaxial layer thereon, wherein said compound semiconductor substrate comprises a material selected from a group consisting of gallium arsenide (GaAs), indium phosphide (InP), gallium phosphide (GaP), and sapphire;
    forming a first bonding layer on said epitaxial layer;
    selecting said high thermal conductivity substrate, said high thermal conductivity layer having a thermal conductivity greater than the thermal conductivity of said compound semiconductor substrate;
    forming a protective layer on said high thermal conductivity substrate;
    forming a wetting layer on said protective layer;
    forming a barrier layer on said wetting layer;
    forming a second bonding layer on said barrier layer pressing said compound semiconductor substrate and said high thermal conductivity substrate at a temperature, such that said first bonding layer and said second bonding layer are integrated to form an alloy layer; and
    removing said compound semiconductor substrate.

17. The method according to claim 16, wherein said high thermal conductivity substrate comprises a material selected from a group consisting of silicon (Si), aluminum (Al), copper (Cu), gold (Au), silver (Ag), silicon carbon (SiC), diamond, graphite, molybdenum (Mo), and aluminum nitride.

18. The method according to claim 16, wherein said protective layer comprises a material selected from a group consisting of nickel (Ni), gold (Au), silver (Ag), and chromium (Cr).

19. The method according to claim 16, wherein said wetting layer comprises a material selected from a group consisting of chromium (Cr), titanium (Ti), and nickel (Ni).

20. The method according to claim 16, wherein said barrier layer comprises a material selected from a group consisting of molybdenum (Mo), platinum (Pt), tungsten (W), indium oxide, tin oxide, indium tin oxide, zinc oxide, and magnesium oxide.

21. The method according to claim 16, wherein said temperature is in a range between about 156° C. and 400° C.

22. The method according to claim 16, wherein said first bonding layer is a metal layer, and said metal layer has a melting point is in a range between about 150° C. and 400° C.

23. The method according to claim 22, wherein said first bonding layer comprises an indium (In) layer.

24. The method according to claim 23, wherein said second bonding layer comprises a layer of gold (Au).

25. The method according to claim 16, wherein said second bonding layer is a metal layer, and said metal layer has a melting point is in a range between about 150° C. and 400° C.

26. The method according to claim 25, wherein said second bonding layer comprises an indium (In) layer.

27. The method according to claim 26, wherein of said first bonding layer comprises a layer of gold (Au).

28. A method for combining a semiconductor structure with a substrate, wherein said substrate is formed of a material selected from a group consisting of silicon (Si), aluminum (Al), copper (Cu), gold (Au), silver (Ag), silicon carbon (SiC), diamond, graphite, molybdenum (Mo), and aluminum nitride, comprising:
    providing said semiconductor structure having a first substrate and an epitaxial layer on said first substrate, wherein said first substrate comprises a material selected from a group consisting of gallium arsenide (GaAs), indium phosphide (InP), gallium phosphide (GaP), and sapphire;

forming a first bonding layer on said epitaxial layer;

forming a protective layer on said substrate;

forming a second bonding layer on said protective layer;

integrating said first bonding layer with said second bonding layer to form an alloy layer; and removing said first substrate.

29. The method according to claim 28, wherein material of said protective layer is selected from a group consisting of nickel (Ni), gold (Au), silver (Ag), and chromium (Cr).

30. The method according to claim 28, wherein said first bonding layer is a metal layer, and wherein said metal layer has a melting point is in a range between about 150° C. and 400° C.

31. The method according to claim 30, wherein said metal layer comprises an indium (In) layer.

32. The method according to claim 31, wherein said second bonding layer comprises a layer of gold (Au).

33. The method according to claim 28, wherein said second bonding layer is a metal layer, and wherein said metal layer has a melting point is in a range between about 150° C. and 400° C.

34. The method according to claim 33, wherein said metal layer comprises an indium (In) layer.

35. The method according to claim 34, wherein material of said first bonding layer comprises a layer of gold (Au).

* * * * *

UNITED STATES PATENT AND TRADEMARK OFFICE
CERTIFICATE OF CORRECTION

PATENT NO. : 6,812,067 B2  Page 1 of 1
DATED : November 2, 2004
INVENTOR(S) : Tzer-Pering Chen, Chih-Sung Chang and Kuang-Neng Yang It is certified that error appears in the above-identified patent and that said Letters Patent is hereby corrected as shown below:

Title page,
Item [54], Title, delete "METHOD FOR INTEGRATING COMPOUND SEMICONDUCTOR WITH SUBSTRATE OR HIGH THERMAL CONDUCTIVITY" and replace with -- METHOD FOR INTEGRATING COMPOUND SEMICONDUCTOR WITH SUBSTRATE OF HIGH THERMAL CONDUCTIVITY --.

Signed and Sealed this

Thirteenth Day of June, 2006

JON W. DUDAS
*Director of the United States Patent and Trademark Office*